(12) United States Patent
Jean et al.

(10) Patent No.: US 8,954,655 B2
(45) Date of Patent: Feb. 10, 2015

(54) SYSTEMS AND METHODS OF CONFIGURING A MODE OF OPERATION IN A SOLID-STATE MEMORY

(71) Applicant: Western Digital Technologies, Inc., Irvine, CA (US)

(72) Inventors: Sebastien A. Jean, Irvine, CA (US); Robert L. Horn, Yorba Linda, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 194 days.

(21) Appl. No.: 13/741,299

(22) Filed: Jan. 14, 2013

(65) Prior Publication Data

US 2014/0201423 A1 Jul. 17, 2014

(51) Int. Cl.
*G06F 12/02* (2006.01)
*G06F 13/40* (2006.01)

(52) U.S. Cl.
CPC .......... *G06F 12/0246* (2013.01); *G06F 13/404* (2013.01)
USPC ........................................................ 711/103

(58) Field of Classification Search
CPC .................................................... G06F 13/404
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |

(Continued)

OTHER PUBLICATIONS

International Search Report and Written Opinion dated Apr. 29, 2014, from PCT/US2-014/011352, filed Jan. 13, 2014, 13 pages.

*Primary Examiner* — Duc Doan

(57) ABSTRACT

Disclosed herein is an architecture that pairs a controller with a NVM (non-volatile memory) storage system. The NVM storage system includes a bridge device that communicates with the controller. In one embodiment, the bridge device allows for certain data locations (blocks, pages or units at any other granularity) in the flash dies to be (1) placed into a reserved mode where data access is prevented (2) assigned into an SLC (Single-Level Cell) mode or an MLC (Multi-Level Cell) mode in response to controller command, (3) made available for data access after the assignment of mode. This flexibility enables the controller to increase SLC mode or MLC mode data locations based on run-time conditions. In one embodiment, the assignment of the reserved data locations is performed in a way to ensure that warranty conditions imposed by the memory vendors are observed.

44 Claims, 13 Drawing Sheets

(56) References Cited

U.S. PATENT DOCUMENTS

| | | | |
|---|---|---|---|
| 8,122,185 | B2 | 2/2012 | Merry, Jr. et al. |
| 8,127,048 | B1 | 2/2012 | Merry et al. |
| 8,135,903 | B1 | 3/2012 | Kan |
| 8,151,020 | B2 | 4/2012 | Merry, Jr. et al. |
| 8,161,227 | B1 | 4/2012 | Diggs et al. |
| 8,166,245 | B2 | 4/2012 | Diggs et al. |
| 8,243,525 | B1 | 8/2012 | Kan |
| 8,254,172 | B1 | 8/2012 | Kan |
| 8,261,012 | B2 | 9/2012 | Kan |
| 8,266,503 | B2 | 9/2012 | Wood et al. |
| 8,281,061 | B2 | 10/2012 | Radke et al. |
| 8,296,510 | B2 | 10/2012 | Radke et al. |
| 8,296,625 | B2 | 10/2012 | Diggs et al. |
| 8,307,151 | B1 | 11/2012 | Caraccio et al. |
| 8,312,207 | B2 | 11/2012 | Merry, Jr. et al. |
| 8,316,176 | B1 | 11/2012 | Phan et al. |
| 8,341,339 | B1 | 12/2012 | Boyle et al. |
| 8,375,151 | B1 | 2/2013 | Kan |
| 8,392,635 | B2 | 3/2013 | Booth et al. |
| 8,397,107 | B1 | 3/2013 | Syu et al. |
| 8,407,449 | B1 | 3/2013 | Colon et al. |
| 8,423,722 | B1 | 4/2013 | Deforest et al. |
| 8,433,858 | B1 | 4/2013 | Diggs et al. |
| 8,443,167 | B1 | 5/2013 | Fallone et al. |
| 8,447,920 | B1 | 5/2013 | Syu |
| 8,458,435 | B1 | 6/2013 | Rainey, III et al. |
| 8,478,930 | B1 | 7/2013 | Syu |
| 8,489,854 | B1 | 7/2013 | Colon et al. |
| 8,503,237 | B1 | 8/2013 | Horn |
| 8,521,972 | B1 | 8/2013 | Boyle et al. |
| 8,549,236 | B2 | 10/2013 | Diggs et al. |
| 8,583,835 | B1 | 11/2013 | Kan |
| 8,601,311 | B2 | 12/2013 | Horn |
| 8,601,313 | B1 | 12/2013 | Horn |
| 8,612,669 | B1 | 12/2013 | Syu et al. |
| 8,612,804 | B1 | 12/2013 | Kang et al. |
| 8,615,681 | B2 | 12/2013 | Horn |
| 8,638,602 | B1 | 1/2014 | Horn |
| 8,639,872 | B1 | 1/2014 | Boyle et al. |
| 8,683,113 | B2 | 3/2014 | Abasto et al. |
| 8,700,834 | B2 | 4/2014 | Horn et al. |
| 8,700,950 | B1 | 4/2014 | Syu |
| 8,700,951 | B1 | 4/2014 | Call et al. |
| 8,706,985 | B1 | 4/2014 | Boyle et al. |
| 8,707,104 | B1 | 4/2014 | Jean |
| 8,713,066 | B1 | 4/2014 | Lo et al. |
| 8,713,357 | B1 | 4/2014 | Jean et al. |
| 8,719,531 | B2 | 5/2014 | Strange et al. |
| 8,724,422 | B1 | 5/2014 | Agness et al. |
| 8,725,931 | B1 | 5/2014 | Kang |
| 8,745,277 | B2 | 6/2014 | Kan |
| 8,751,728 | B1 | 6/2014 | Syu et al. |
| 8,769,190 | B1 | 7/2014 | Syu et al. |
| 8,769,232 | B2 | 7/2014 | Suryabudi et al. |
| 8,775,720 | B1 | 7/2014 | Meyer et al. |
| 8,782,327 | B1 | 7/2014 | Kang et al. |
| 8,788,778 | B1 | 7/2014 | Boyle |
| 8,788,779 | B1 | 7/2014 | Horn |
| 8,788,880 | B1 | 7/2014 | Gosla et al. |
| 8,793,429 | B1 | 7/2014 | Call et al. |
| 2008/0126680 | A1 | 5/2008 | Lee et al. |
| 2008/0215800 | A1 | 9/2008 | Lee et al. |
| 2009/0259799 | A1 | 10/2009 | Wong |
| 2010/0122016 | A1 | 5/2010 | Marotta et al. |
| 2010/0174849 | A1 | 7/2010 | Walston et al. |
| 2010/0250793 | A1 | 9/2010 | Syu |
| 2011/0099323 | A1 | 4/2011 | Syu |
| 2011/0283049 | A1 | 11/2011 | Kang et al. |
| 2012/0240012 | A1 | 9/2012 | Weathers et al. |
| 2012/0254549 | A1 | 10/2012 | Hutchison et al. |
| 2012/0254574 | A1 | 10/2012 | Sinclair et al. |
| 2012/0260020 | A1 | 10/2012 | Suryabudi et al. |
| 2012/0278531 | A1 | 11/2012 | Horn |
| 2012/0284460 | A1 | 11/2012 | Guda |
| 2012/0324191 | A1 | 12/2012 | Strange et al. |
| 2013/0132638 | A1 | 5/2013 | Horn et al. |
| 2013/0145106 | A1 | 6/2013 | Kan |
| 2013/0290793 | A1 | 10/2013 | Booth et al. |
| 2014/0059405 | A1 | 2/2014 | Syu et al. |
| 2014/0101369 | A1 | 4/2014 | Tomlin et al. |
| 2014/0115427 | A1 | 4/2014 | Lu |
| 2014/0133220 | A1 | 5/2014 | Danilak et al. |
| 2014/0136753 | A1 | 5/2014 | Tomlin et al. |
| 2014/0149826 | A1 | 5/2014 | Lu et al. |
| 2014/0157078 | A1 | 6/2014 | Danilak et al. |
| 2014/0181432 | A1 | 6/2014 | Horn |
| 2014/0223255 | A1 | 8/2014 | Lu et al. |

SYSTEMS AND METHODS OF CONFIGURING A MODE OF OPERATION IN A SOLID-STATE MEMORY

BACKGROUND

1. Technical Field

This disclosure relates to non-volatile storage systems, including but not limited to flash drives. More particularly, the disclosure relates to systems and methods for an enhanced controller architecture in solid state drives.

2. Description of the Related Art

Various types of controller architecture exist for controlling flash media. The Open NAND Flash Interface (ONFI) is a standard interface that specifies some common sets of commands that flash memory manufacturers should support. ONFI supports some low level rudimentary I/O operations that can include, for example, page write/read and block erase. However, effective flash media management often involves a number of high level and potentially process-intensive functions such as logical-to-physical mapping, garbage collection, and wear leveling. These functions are beyond the scope of ONFI and thus an effective controller architecture needs to address these needs while providing a high level of data throughput performance to the host.

BRIEF DESCRIPTION OF THE DRAWINGS

Systems and methods that embody the various features of the invention will now be described with reference to the following drawings, in which.

DETAILED DESCRIPTION

While certain embodiments of the inventions are described, these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions.

I. Controller/Bridge Designs

Figure 1A:
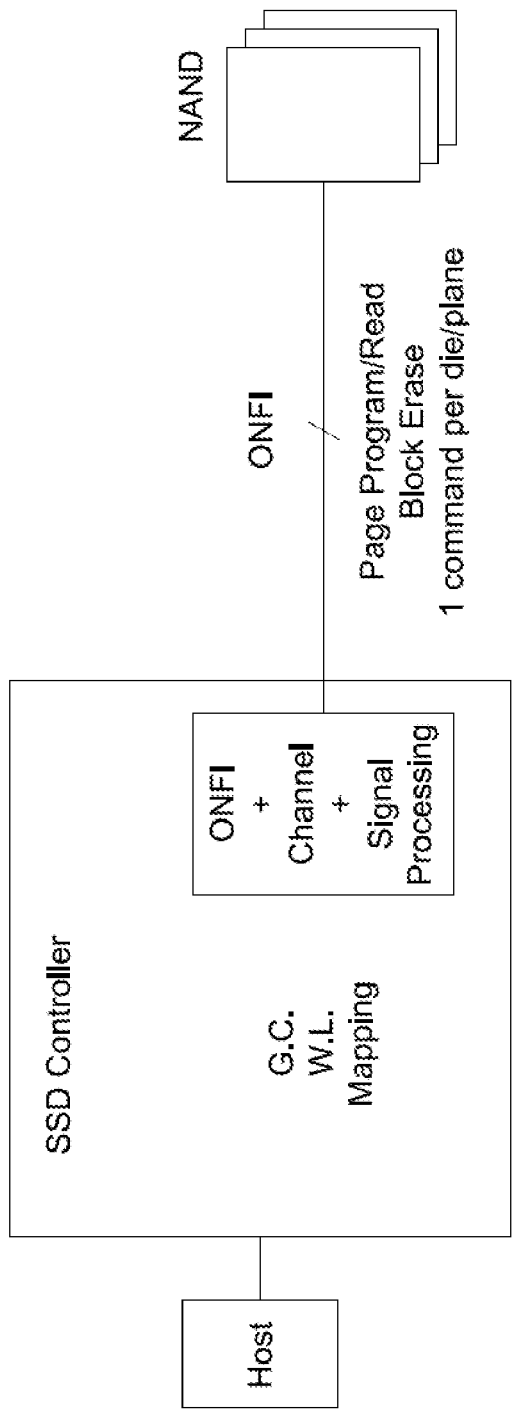
FIGS. 1A-1C illustrate several solid-state drive (SSD) controller architectures.
Figure 1B:
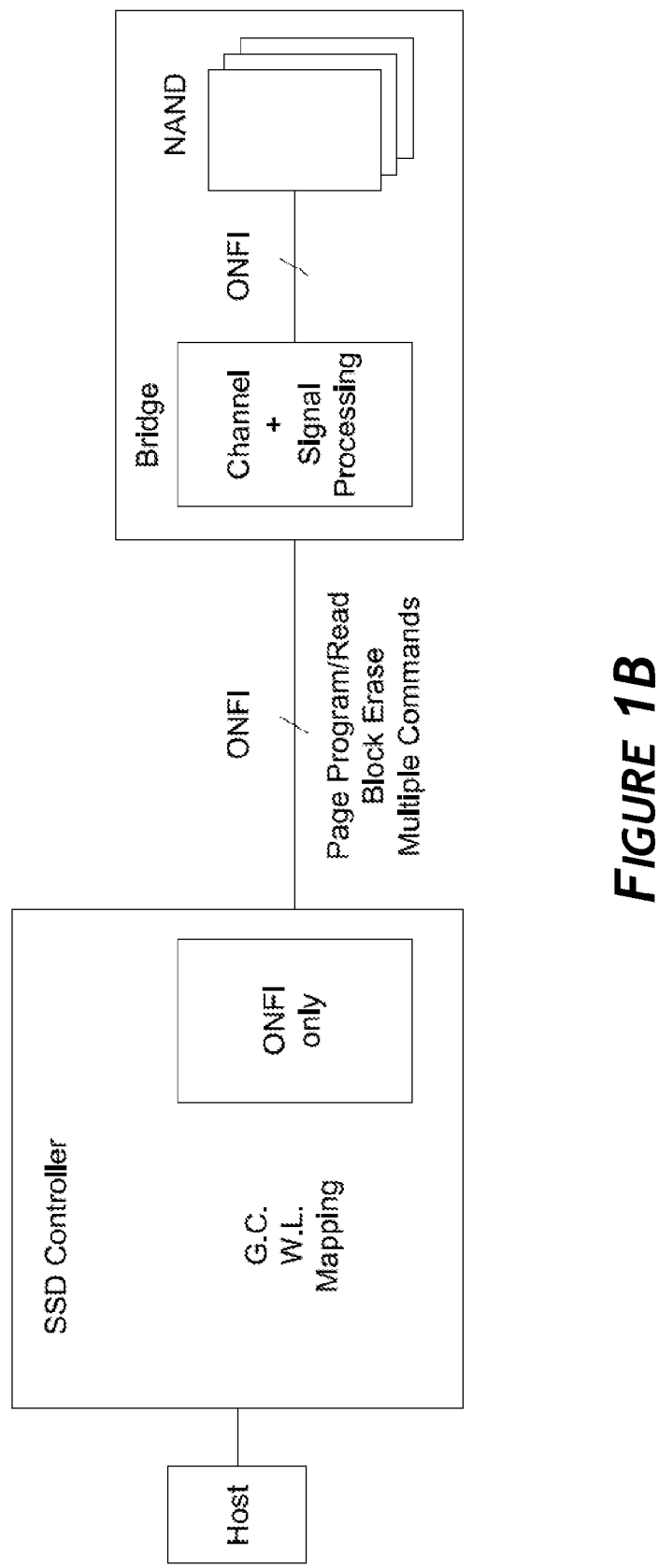
Figure 1C:
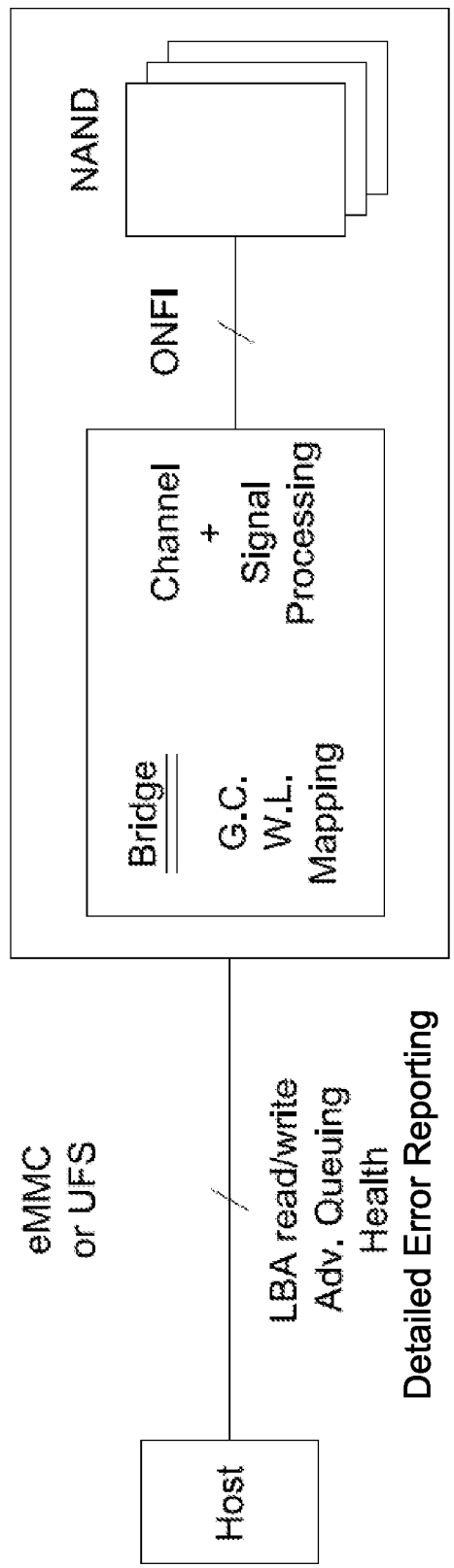

FIGS. 1A-1C illustrate a number of SSD controller architectures. FIG. 1A illustrates a SSD controller that includes an ONFI (Open NAND Flash Interface) interface. The ONFI interface is a low level, parallel I/O interface that provides basic command support to enable an external component such as a host controller to control operations in a NAND. FIG. 1A shows a typical setup in which a host device such as a computer that includes a SSD controller, which in turn includes an ONFI interface for controlling a non-volatile memory (NVM) unit that supports ONFI. The ONFI interface provides some basic level of control over operations such as page program, page read, block erase, etc. Current versions of ONFI support one command per die and plane, and provide some basic queuing capability through commands such as "read multiple" and "write multiple" commands. However, there can be no mixing of different types of commands. Moreover, commands are batch processed, which means that the commands must clear the queue completely before more commands can be accepted. The SSD controller in this approach would perform high level NVM management functions such as garbage collection, wear leveling, mapping etc.

FIG. 1B illustrates an alternative approach in which the NVM is coupled with a bridge controller/device that performs some level of basic channel management of the NAND and signal processing. The bridge may provide an ONFI or ONFI-equivalent interface to the SSD controller. However, this interface may be modified from the standard ONFI interface, and may support additional capabilities such as supporting multiple commands. The SSD controller, in this design, would still perform high level NAND management functions such as garbage collection, and communicate with the bridge via the ONFI or ONFI-equivalent interface.

FIG. 1C depicts a third approach in which the NVM is coupled with a bridge in a storage system. In this approach, the bridge performs a number of high level NVM management functions such as garbage collection, wear leveling, and mapping, as well as the lower level functions such as channel management and signal processing. The storage system is coupled with the host device through a high level I/O interface such as eMMC or UFS. This is a common design found in many memory card products. The host sends over commands to the storage system (such as read and write commands) using logical addressing. Features such as advanced command queuing, health reporting, and detailed error reporting may be supported.

II. System Overview

Figure 1D:
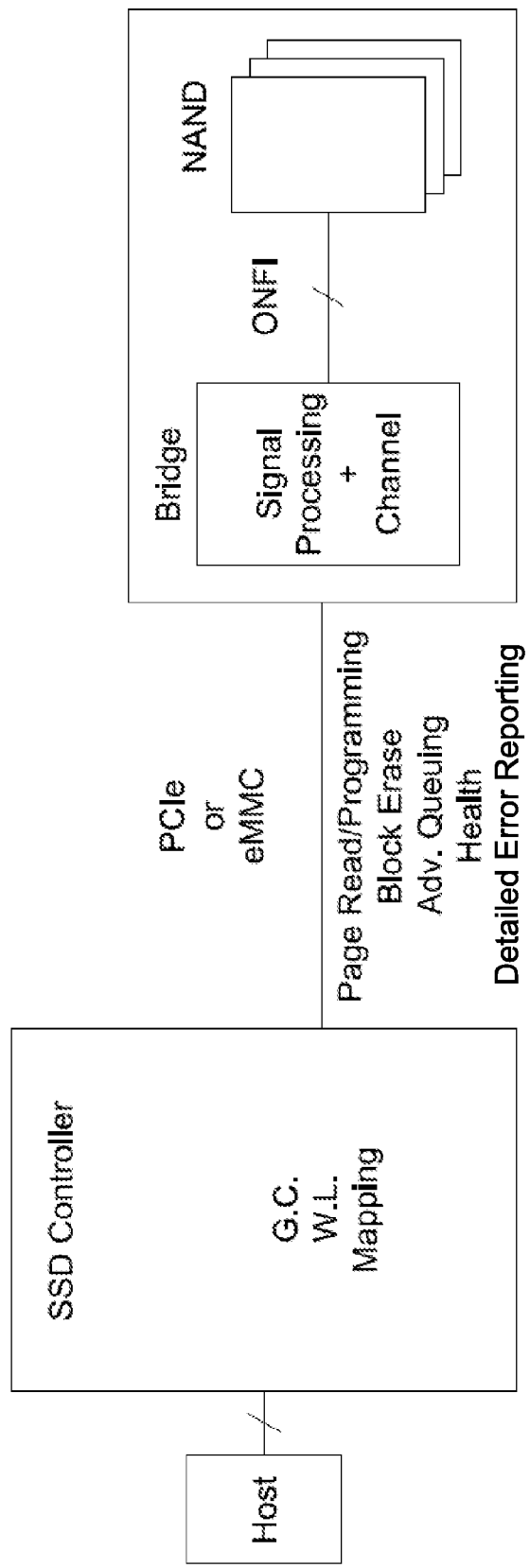
FIG. 1D is a block diagram showing the controller architecture according to an embodiment.

FIG. 1D is a block diagram that illustrates a controller design architecture according to some embodiments of the invention. FIG. 1D shows a SSD controller performing high level NVM management functions such as garbage collection, wear leveling, etc. In one embodiment, the SSD controller is coupled with a NVM storage system over a high level, high speed interface such as PCIe and eMMC. In lieu of PCIe or eMMC, other standardized and/or proprietary interfaces could be extended for use as this bus interface. The NVM storage system in one embodiment includes a bridge that communicates with the SSD controller via the high level, high speed interface, and controls the NAND memory with a low level interface such as ONFI. As shown, additional features such as advanced command queuing, health reporting, and detailed error reporting may be supported over the high level interface.

Unlike the designs described above, the controller in this architecture is provided a rich set of physical level of controls over individual elements of the NVM (e.g., page level control) over a sophisticated and fast interface such as PCIe. It is observed that in many controller-bridge type designs that the bridge is typically implemented on a processor with reduced performance due to power concerns, while the controller typically is in an environment that faces less power concerns. If the processor intensive functionalities are shifted to the higher performing controller, then overall latency can be reduced. Thus, in some embodiments, the controller is typically implemented in a higher powered processor that can support the advanced NVM management functions. The bridge, on the other hand, is implemented in some embodiments in a lower powered processor to minimize energy usage of the overall NVM storage module/unit. As a result, the bridge may perform basic signal processing and channel management of the NVM, as well as some basic error correction functions and XOR parity accumulation. In some embodiments, the controller performs logical-to-physical address mapping, garbage collection, wear leveling, parity management (via control of the parity accumulator in the bridge), RAID striping, etc. This division of labor still provides the controller direct, physical (e.g., page-level) control of the NVM, resulting in the controller managing the NVM at both the page and block level over a fast, high level interface such as PCIe. The controller in one embodiment also manages other integrated services such as the XOR parity accumulator in the bridge.

In one embodiment, another advantage of the architecture's division of the management tasks relates to NVM industry trends. Physical management of the NVM is becoming increasingly important as the most common type of NVM, e.g., MLC (Multi-Level Cell) NAND, continues to evolve to provide higher capacity at the cost of reduced endurance. For example, today's MLC products with a 5,000 P/E-cycle endurance are being replaced with next-generation MLC products with a 1,500-2,000 P/E-cycle endurance. Commonly, the bridge designer is in the best position to understand the physical properties of the NVM and how best to extend its life by implementing various endurance enhancement/management functionalities. Because of this rapidly changing technological landscape, and because each individual NVM manufacturer may require different such endurance enhancement/management functionalities, these functionalities may constantly require fine-tuning to suit the diverse and ever-change varieties of NVM products. Thus, the architecture of some embodiments provides another advantage in its labor division by isolating these functions in the bridge and allowing the controller designer to focus on the high level data management functions. In other words, since the controller and the bridge have different design constraints and priorities, under the architecture each may be updated according to different schedules and manners without a complete redesign of the whole.

With the reduced latency provided by the design, the bridge may be paired with less expensive media. For example, the bridge may be paired with MLC NAND rather SLC (Single-Level Cell) NAND while still meeting performance metrics demanded by customers. In addition, in some embodiments the above described controller-bridge design can be adapted for use in a hybrid drive comprising flash memory and hard disk components. In those embodiments the controller, in addition to managing data accesses to the NVM through the bridge, would also manage data accesses to one or more hard drives. Additional features of this design will be further illustrated below with various drawings and descriptions of the embodiments of the invention.

II.A. Controller-Bridge Implementation

Figure 2A:
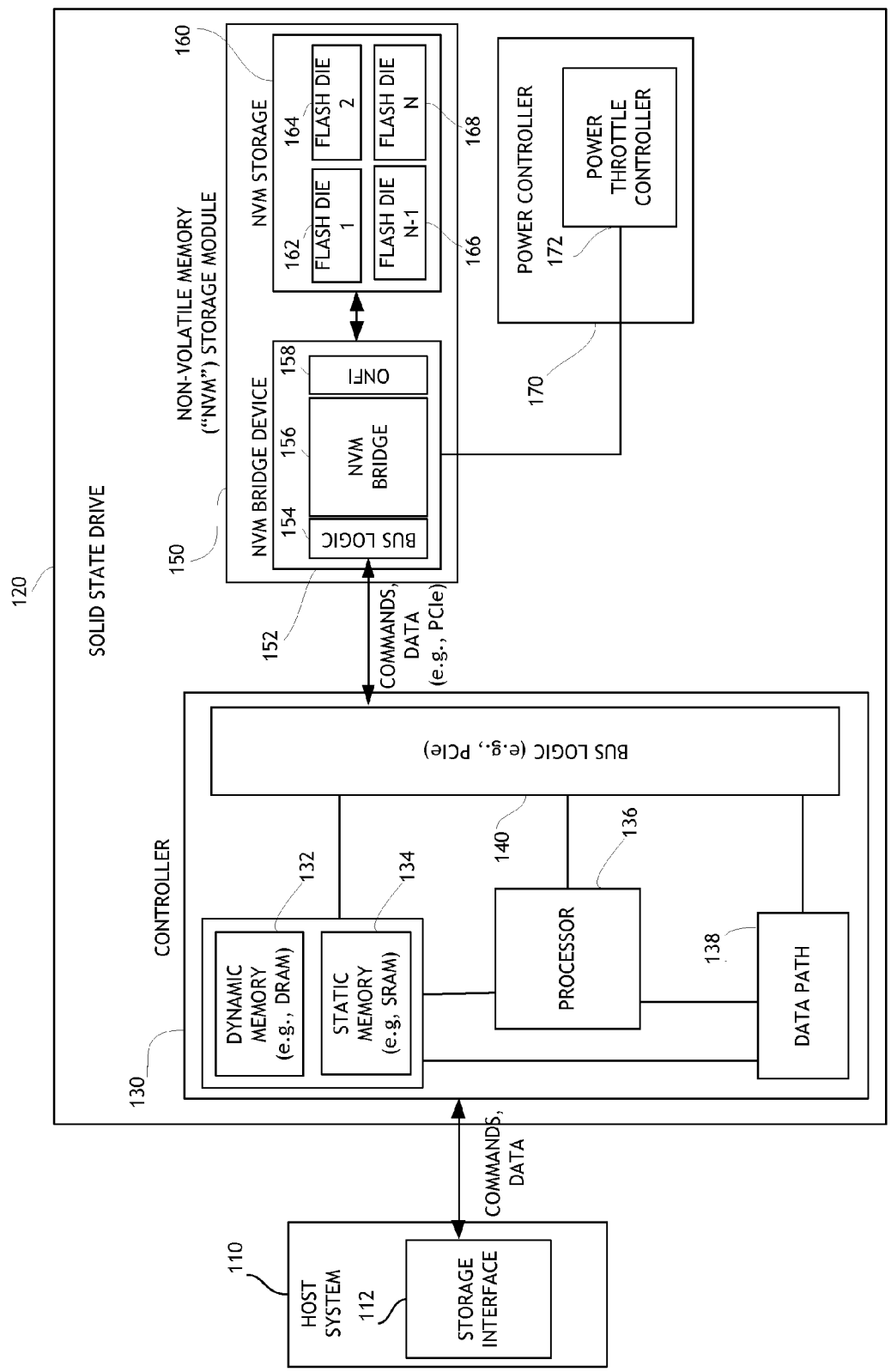
FIGS. 2A and 2B are block diagrams showing the controller architecture according to some embodiments.

FIG. 2A shows an embodiment of a controller-bridge architecture previously introduced in FIG. 1D. As shown, a solid-state non-volatile storage system 120 is connected to a host system 110. The host system 110 communicates with the non-volatile storage system 120 using a storage interface 112. The host's storage interface 112 can communicate with the non-volatile storage system 120 using any known communication protocol, such as SATA, SCSI, SAS, USB, Fibre Channel, PCIe, eMMC, etc.

In one embodiment, the non-volatile storage system 120 includes a controller 130 and a NVM storage module 150. The controller 130 in one embodiment communicates with a bridge device 152 within the NVM storage module 150 via a high level interface such as PCIe (through bus logic/interface 140). PCIe is used in one embodiment as it defines a rich packet based routing and Quality of Service (QoS) infrastructure and provides a high speed interface. The controller may include a processor 136 to control data functions, and the core may be coupled with static memory 132 and dynamic memory 134. The controller 130 may also include a data path 138 for processing/transferring data related to data access commands from the host system 110. In one embodiment, the controller 130 is implemented on a SoC (System on Chip), though those skilled in the art will recognize that other hardware/firmware implementations are possible.

In one embodiment, the use of PCIe means that the address range assigned to a device function is used for packet routing both on the fabric and within the device. In one embodiment, the PCIe transaction layer delivers packets to an internal register interface that is read by firmware. Advanced devices often direct incoming packets to internal RAM or hardware acceleration modules.

The bridge device 152 in one embodiment comprises bus logic/interface 154 for communicating with the bus logic/interface 140 (on the controller 130) over the high level interface bus. On the other end of the bridge, the bridge device 152 includes a low level interface 158 such as ONFI for communicating with the NVM storage 160 (e.g., NAND), which may include a number of storage devices such as flash dies 162, 164, 166, and 168. Although ONFI is depicted in this embodiment, other suitable flash memory interfaces may be used. In another embodiment, the bridge may use a different interface such as Toggle or a proprietary interface to communicate with the NVM storage 160, or send direct commands to the storage.

II.B. Division of Labor

The advantages of dividing the NVM management functions were outlined above in Section II. In particular, the architecture reduces latency and addresses the various design constraints while allowing the controller and bridge designers to optimize their respective portions of the architecture. In one embodiment, the controller is responsible for block level management, parity stripe layout, garbage collection, wear leveling, handling read disturb and error recovery. The bridge device, in one embodiment, manages the raw NVM flash interface. It may also provide one or more of: command queuing, error correction, XOR parity accumulator, data protection, and enhances block endurance. The interface between the bridge and the controller in one embodiment is a lightweight PCIe-based data and management interface. The controller uses the interface control command to configure the bridge and data commands to access the NVM media.

It is also noted that the controller uses physical page addressing instead of a logical one that is common in existing controller-bridge designs. The bridge can identify the relationship between pages, blocks, planes, and dies. This gives the controller the greatest flexibility for creating RAID stripe layout, performing data moves, and handling bad blocks. These details are abstracted from the bridge. When using direct addressing, the controller simply provides a set of direct page addresses in the command header to the bridge. In one embodiment, the pages are not necessarily sequential or even in the same block. In most cases, the controller will access pages spread across multiple planes and multiple dies in order to maximize concurrent hardware access.

II.C. Hybrid Application

Figure 2B:
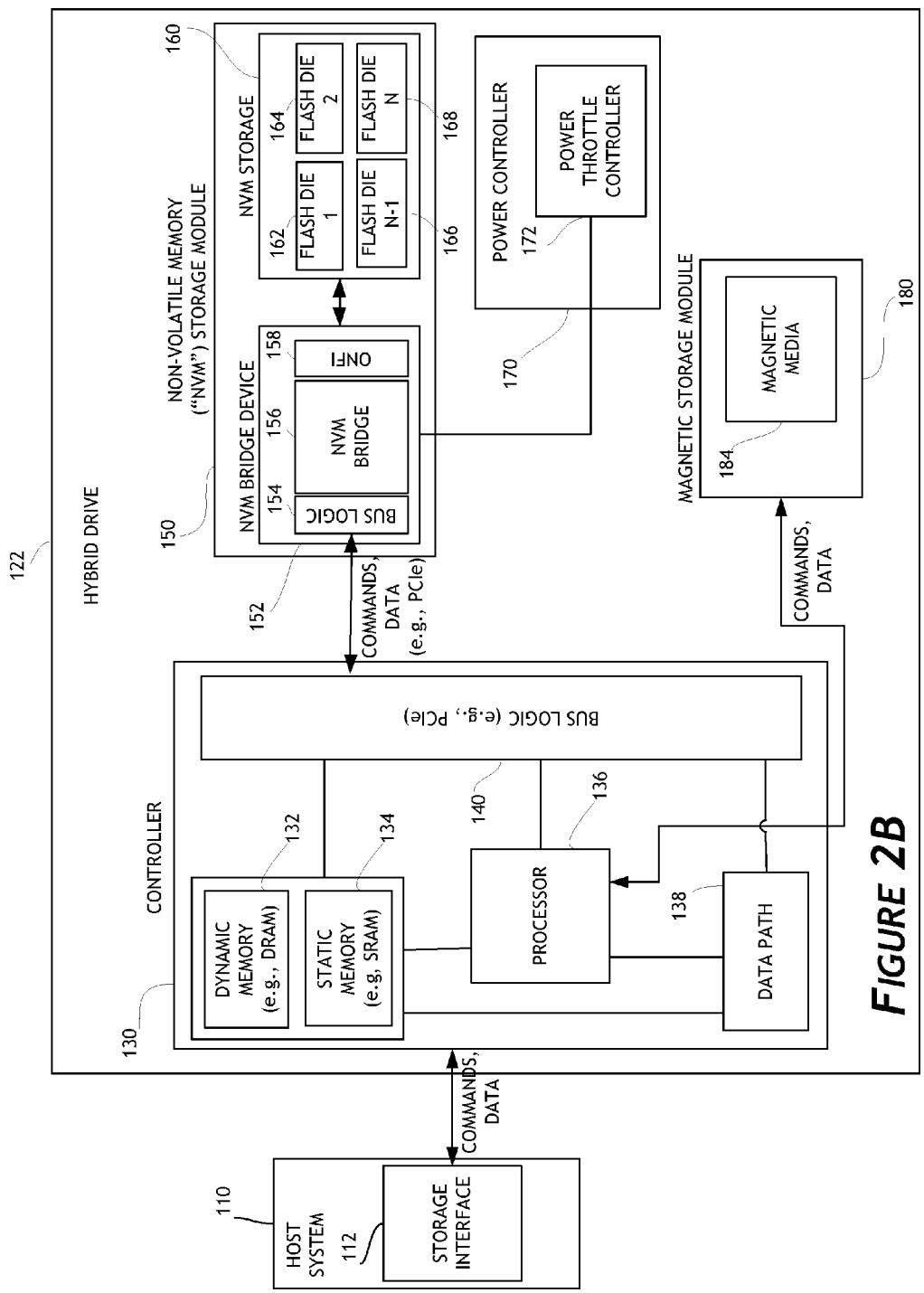

Some embodiments of the controller-bridge architecture can be adapted for other uses. For example, FIG. 2B shows the use of the controller architecture in a hybrid drive 122, which in addition to the NVM and bridge components described above, includes a magnetic storage module 180 which has a magnetic media 184 such as a rotating hard disk drive (HDD). The controller 130 in this embodiment would thus manage data accesses to both the NVM storage module 150 and magnetic storage module 180. In one embodiment, a different interface than interface 140 (which connects to the NVM) may be used to connect the controller 130 to the magnetic storage module 180.

The hybrid application illustrates an additional advantage of the controller architecture. A hybrid drive typically includes an SSD that has its own internal controller that has a mapping table to address the NVM within the SSD. While the HDD portion of the hybrid is typically addressed directly, the hybrid controller uses a special mapping table to determine whether data is in the SSD or the HDD. The use of this special mapping table along with the internal SSD mapping table introduces duplicate overhead in cases where data is accessed in the SSD portion of the hybrid, since there are two mapping tables and there is significant cost associated with maintaining each table.

In contrast, because the controller 130 in the present architecture manages the NVM at both the block and page levels and the magnetic media, it can provide uniformed address management across the flash and magnetic media in a single location. Hence there is no need to have the two tables noted above. This has the advantages of reducing duplicative table lookups and all the associated costs/complexities related to maintaining separate mapping tables. Direct page addressing is used in the unified mapping scheme.

In addition, in a hybrid application, the NVM could still provide effective performance enhancement even when it has a large amount of bad blocks (e.g., 50%). In one hybrid embodiment, the controller also has efficient address gap handling capability (on gaps caused by the bad blocks). In an alternative hybrid embodiment, the unified addressing scheme does not necessarily require a bridge to work with the controller. The controller can potentially use a raw NVM interface (e.g., ONFI) to access the NVM.

III. Data Command Processing

Figure 3:
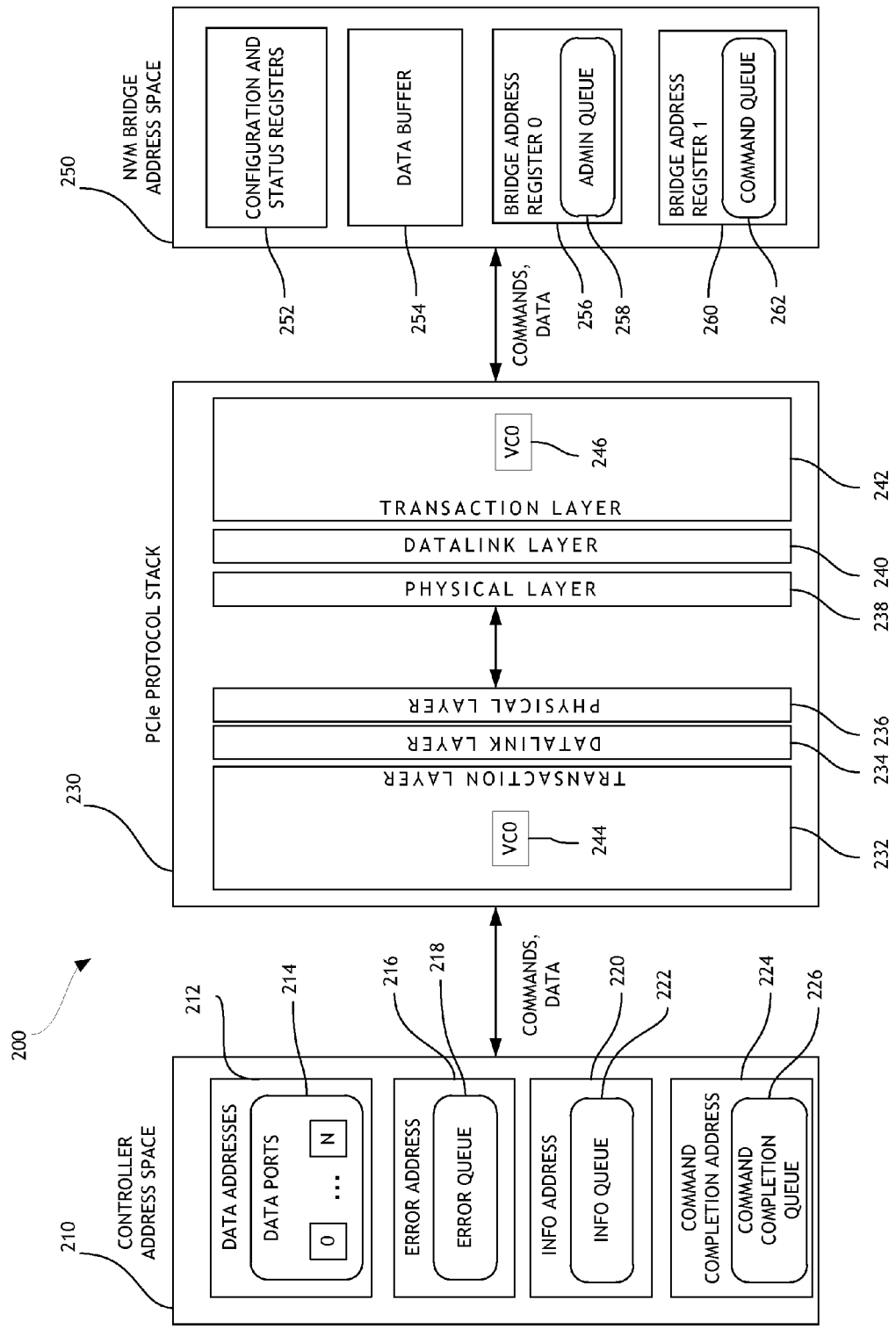
FIG. 3 is a block diagram illustrating the command processing components between the controller and the bridge device according to one embodiment.

FIG. 3 is a block diagram illustrating the command processing components between the controller and the bridge device according to one embodiment. Using the construct of the PCIe interface (or other equivalent interfaces), both the controller and the bridge implement its own address spaces (210, 250) in their respective device memories that can be addressed by the other device. Messages are communicated by writing to queues located within certain addresses within the address spaces, and the addresses are stored in the configuration and status registers 252 in one embodiment. The use of individual queues to handle data access commands and communications between the controller and the bridge will be further described below.

III.A. Command and Admin Queues—Bridge

In one embodiment, the controller sends data access commands to a command queue 262 in the bridge device. This is performed by the controller sending data command messages to the bridge (by writing to the command queue BAR (base address register)). In one embodiment, the command queue has room for sixteen messages, though the number of messages can vary in other embodiments. The command queue can be implemented in a number of ways. One option is full hardware automation where the controller simply writes to a fixed offset. Alternately it can be implemented in memory using a ring buffer or an array based linked list. In one embodiment, the implementation must allow for efficient insertion and notification with minimal bus traffic. In one embodiment, the controller knows the current queue depth based on the number of status responses the bridge has sent back (e.g., a message to the controller's completion queue indicating completion of a command). Note that the data commands are much smaller than the actual data. A given record slot in the queue is considered available once the bridge sends back a completion status or an error report.

In the embodiment shown in FIG. 3, the bridge side 250 also implements configuration and status registers (CSR) 252, along with an admin queue 258 for receiving, from the controller, command messages related to operation of the command queue (e.g., a message for pausing the command queue) or administrative messages concerning the bridge's operation in general. The admin queue 258 may be implemented in a fashion that is similar to the command queue, such as through full hardware automation or ring buffer. Also, like the command queue, the admin queue may be configured for efficient insertion and notification with minimal bus traffic. Like the command queue, the controller can derive the current queue depth and available slots based on responses from the bridge.

III.B. Status Queues—Controller

On the controller side 210 are a set of data ports 214 at data addresses 212 and a number of status queues. In one embodiment, the status queues include an error queue 218, an information queue 222, and a command completion queue 226. These queues are responsible for receiving messages from the bridge regarding command processing, as well as current status of the bridge and the NVM.

III.C. Communications Between the Controller and the Bridge

Communications between the controller and the bridge are effected in one embodiment through a PCIe protocol stack 230 which includes a number of layers on both sides, including a transactional layer (232, 242), a data link layer (234, 240), and physical layer (236, 238). While PCIe is used in this disclosure to illustrate the operation of the controller and the bridge, other similar standards can be used as well.

The PCIe transaction layer assigns transmit credits based on how much room is left in its Virtual Channel (VC) buffer space. According to the PCIe specification, devices must implement VC0, though some devices implement additional VC to ensure high priority messages have dedicated resources. Packets are directed to the appropriated VC based on their Traffic Class (TC). The TC is also used to determine priority when packets are flowing over the PCIe fabric. Higher TC packets are generally given priority by the root complex, switches and end-devices.

In one embodiment, the controller is designed to operate using only VC0. In one embodiment, though the bridge may implement additional VC, it must be configurable so that it can operate in single VC mode. The messages communicated between the controller and the bridge will be better understood in view of the following brief description of the data processing flow. To service a read command from the host, the controller may first send a command message to the bridge's command queue. Once the bridge processes the command message, it will read the requested data from the NVM and send the read data back to a corresponding data port on the controller side. This action triggers the data path on the controller, which leads to the data being sent back to the host. Conversely, to service a write command from the host, the controller may first send a command message to the bridge's command queue. Once the bridge processes the command message, it will read from a corresponding data port on the controller side. This action triggers the data path on the controller, which leads to the write data being sent from a buffer in the controller to the bridge for writing to the NVM.

The controller in one embodiment communicates with the bridge using three message types of increasing priority: data to be written to the NVM for write commands (0), messages for the bridge's command queue (1), and messages for the bridge's admin queue (2). Those skilled in the art will recognize that different priorities may be assigned to these messages, and the messages could be combined into fewer types or divided into more types depending on the implementation. In one embodiment, under normal conditions, the controller sends a steady stream of data packets to the bridge.

In one embodiment, the bridge interacts with the controller using its own set of prioritized message types (listed here in increasing priority): data read from the NVM for read commands (0), messages for the controller's completion/info queues (1), and messages for the controller's error queue (2). Those skilled in the art will recognize that different priorities may be assigned to these messages, and the messages could be combined into fewer types or divided into more types depending on the implementation. As will be further described below, to facilitate fast processing of data access commands, a read or write by the bridge to a data port in the controller automatically triggers the data path in the controller. In one embodiment, it is not uncommon for the bridge to process several commands in parallel. In one embodiment, the bridge uses the completion queue 226 to notify the controller when commands have completed successfully. In additional, non-critical messages are sent to the info queue 222 while detailed error reports are sent to the error queue 218. In other embodiments, these queues may be combined into fewer queues (with different message types being distinguished by special flags or implied address values) or separated into more queues (e.g., different error queues for different types of error or different info queues for different types of information returned from the bridge).

In other embodiments where a different interface than PCIe is used, the PCIe protocol stack may be replaced with the appropriate stacks/layers of that interface. Those skilled in the art will recognized that other equivalent standardized interfaces (e.g., eMMC) may be adapted to replace PCIe. In other embodiments, a custom/proprietary interface may be used to handle communications between the controller and the bridge.

IV. SLC/MLC Mode Management

A common type of solid state memory used is Multi-Level Cell (MLC) NAND memory, which is ordinarily capable of operating in at least one Multi-Level Cell (MLC) mode or a Single-Level Cell (SLC) mode. In one embodiment, the NVM Bridge architecture described above allows for certain data locations (blocks, pages, or units at any other granularity) in the flash dies to be (1) placed into a reserved mode where data access is prevented, (2) assigned into an SLC mode or an MLC mode in response to controller command, (3) made available for data access after the assignment of mode. This flexibility enhances the functionality of the overall system in several ways, including giving the controller a way to increase SLC mode or MLC mode data locations based on run-time conditions and/or product configurations. In one embodiment, the assignment of the reserved data locations is performed in a way to ensure that external constraints, such as warranty conditions imposed by the memory vendors, are observed.

IV.A. Overview

Figure 4:
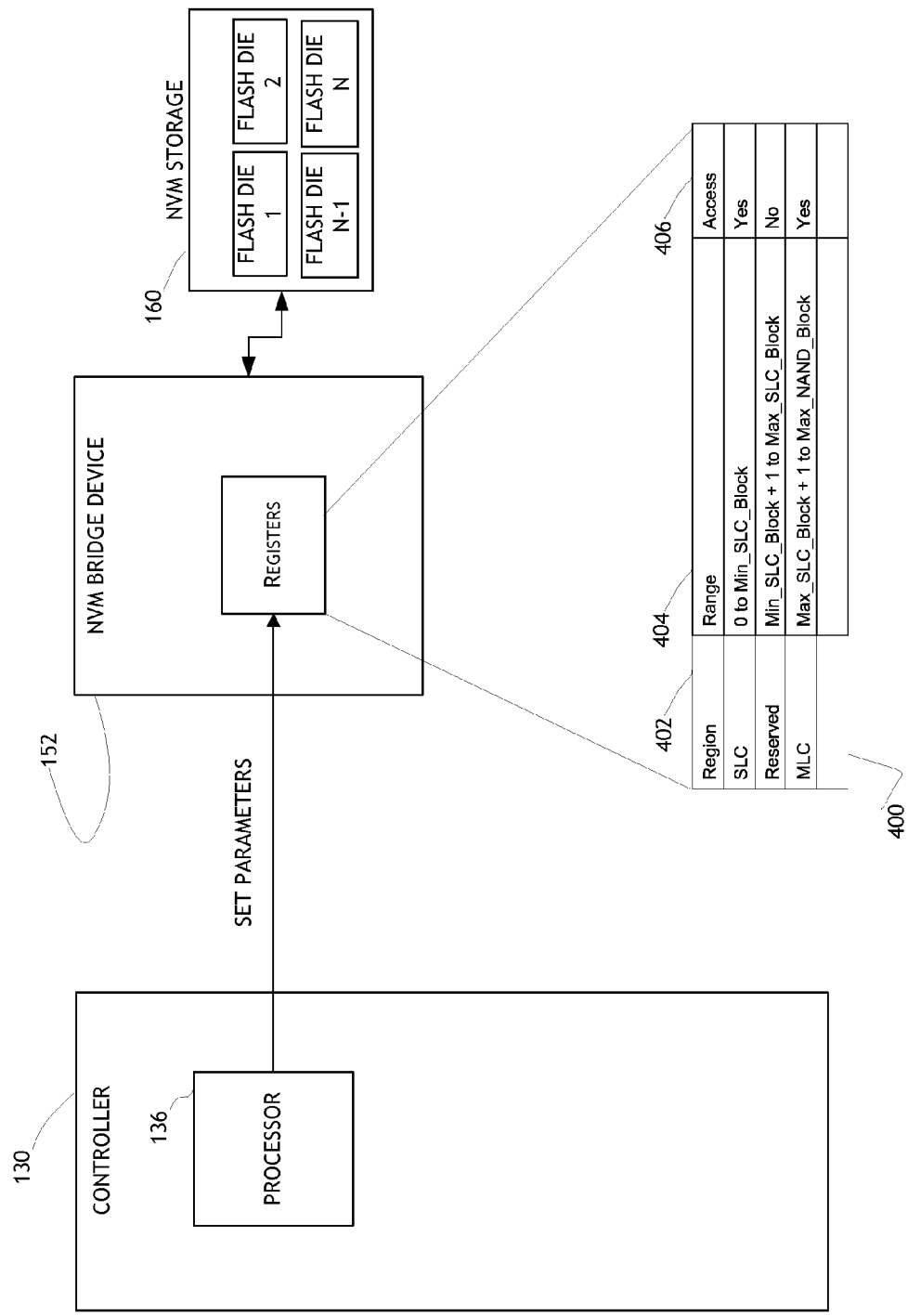
FIG. 4 is a block diagram showing how the bridge device responds to mode configuration commands from the controller according to one embodiment.

FIG. 4 is a block diagram showing how the bridge device responds to mode configuration commands from the controller according to one embodiment. As previously described above, in one embodiment, the bridge device 152 is coupled with a NVM storage 160 which includes one or more flash dies. In one embodiment, the bridge device takes commands from the controller 130 over a bus (e.g., a PCIe bus described above) and executes data access commands in the NVM storage 160. The type of bus protocol is not limited to PCIe and other protocols may be used in other embodiments. The bridge device 152 may also have some intelligence on how to extend the life of the flash dies.

The flash dies may include MLC cells that can operate in an MLC or an SLC mode. For example, in MLC cells that can store up to 2 bits of data per cell, placing a block in SLC mode reduces the data capacity from 2 bits per cell down to 1 bit per cell. On the other hand, operating in SLC mode yields better program/erase (P/E) endurance. It is common to have the MLC cells set to operate in one mode or another before the storage device reaches the field of use, as a result of warranty restrictions imposed by the memory manufacturer. In this disclosure, the term MLC refers to memory cells that are capable of storing 2 or more bits per cell. In implementations with more than 2 bits per cell, there exists several levels of MLC mode, and the adjustment methods disclosed here are applicable to assign cells to operate at those different MLC levels. For example, in memory where a 3-bit per cell mode is available, reserved region may be assigned to operate in a 3-bit per cell MLC mode, a 2-bit per cell MLC mode, or an SLC mode.

Some embodiments of the invention allow certain memory blocks to be placed, as needed, in a reserved region to be used by the controller 130 for improving endurance, performance and reliability at the cost of reducing storage capacity. Some examples may include managing high-access hotspots and storing critical system data. Commitment of the reserved blocks to either the MLC mode or the SLC mode does not need to be made at the beginning of life of the storage device and the controller has the flexibility to choose how much to allocate during the course of life. To achieve this, in one embodiment, the bridge device provides a method of allowing the controller to place a range of reserved data locations into SLC or MLC mode at run time. For example, the controller can set mode through sending one or more commands to the bridge device. For example, if PCIe is used, the CSR 252 as shown in FIG. 3 could be used to allow the commands to be communicated through setting of fields inside the CSR.

In one embodiment, two register fields are used to establish the range of the reserved data locations: a staring address (e.g., min_slc_block) and an ending address (e.g., max_slc_block). The starting and ending addresses define the reserved region. In other embodiments, the controller 130 can indicate the range of the reserved region through one or more commands directly instead of using registers (e.g., sending commands over a bus with a protocol such as SATA).

As shown in the table 400 of FIG. 4, in one embodiment, the starting and ending address values define three regions 402: SLC, Reserved, and MLC. Both the SLC and MLC regions can be accessed normally, as indicated by the access values 406. The Reserved region's access value indicates that it cannot be accessed to prevent the blocks within the region from being used. It is noted that table 400 is a teaching example intended to illustrate the concepts and that the actual values or types of values stored in the registers or sent by commands to achieve the same configuration may be different.

Figure 7A:
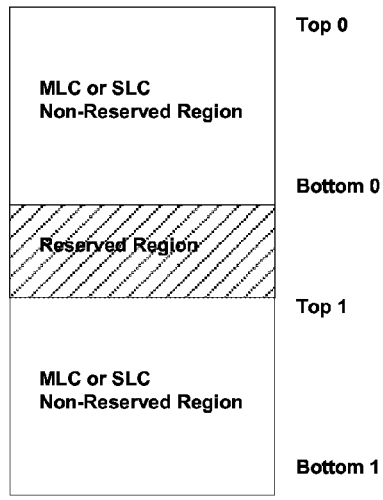
FIGS. 7A and 7B show example operating mode configuration settings for multiple ranges of data locations according to various embodiments.
Figure 7B:
Figure 7B:
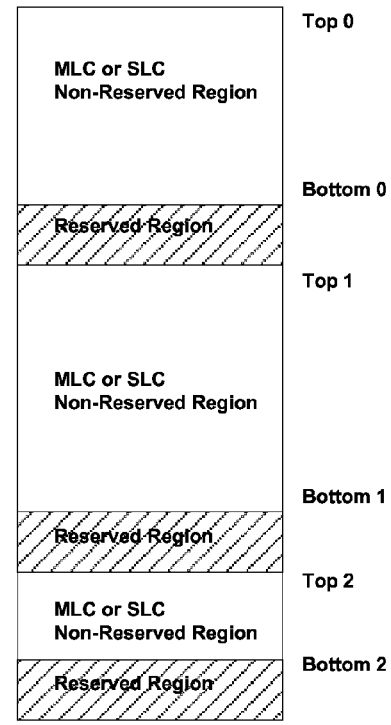

In one embodiment, the regions can be of a different configuration, as will be further shown in FIGS. 7A and 7B. In one embodiment, the configuration is applied to each plane across all dies. In another embodiment, each die or each subset of dies may have its own configuration of regions, as will be further shown in FIGS. 8A and 8B.

IV.B. Procedure for Growing MLC or SLC Region

Figure 5A:
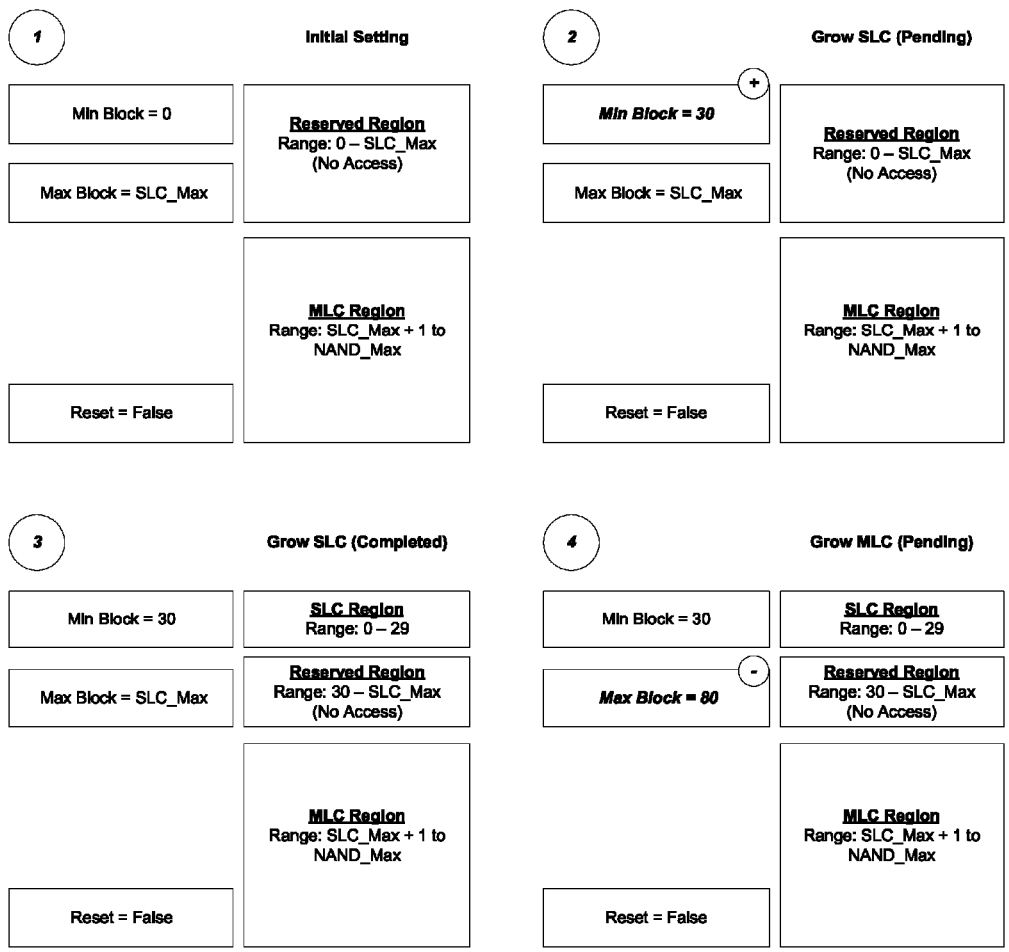
FIGS. 5A and 5B illustrate example operating mode configuration settings of data locations according to one embodiment.
Figure 5B:
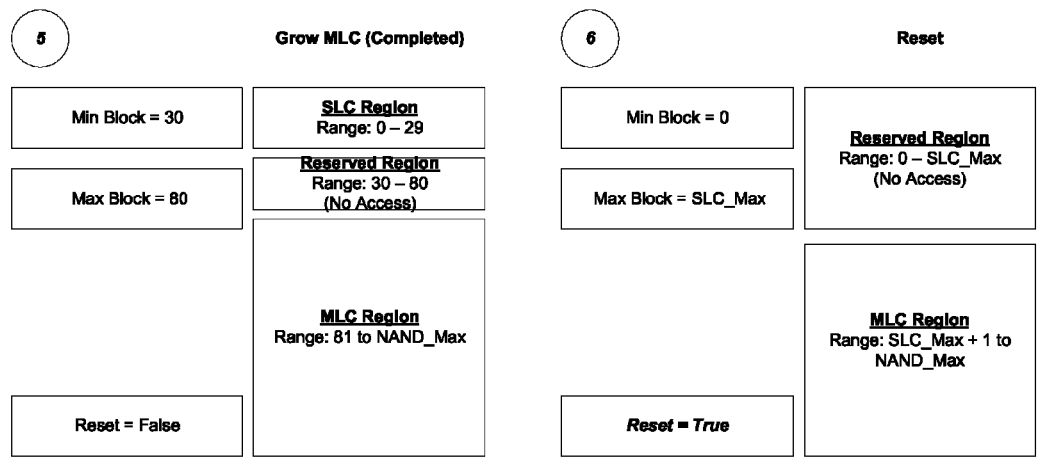

FIGS. 5A and 5B illustrate example operating mode configuration settings of data locations according to one embodiment. Illustration 1 of FIG. 5A shows an initial setting of an address range. The range is divided into a reserved region (0 to SLC_Max) and an MLC region (SLC_Max+1 to NAND_Max), where SLC_Max and NAND_Max are addresses in the range. For example, SLC_Max may be 255 and NAND_Max may be 1023 in a die with 1024 data blocks/data locations. On the left side of Illustration 1 are the boundary values of the Reserved Region, with a starting address (Min Block=0) and an ending address (Max Block=SLC_Max). As discussed above, the bridge device prevents access to data locations within the reserved region.

To change the size of the reserved region (and correspondingly, the size of an adjacent non-reserved region), the starting and ending address values may be changed via a command from the controller, or via setting of register values in the bridge device. In Illustration 2, the starting address (Min Block) is changed from 0 to 30. In Illustration 3, the Reserved region is adjusted correspondingly, so that it now starts at 30. The data locations in the range 0 to 29 are now assigned to an SLC region (i.e., assigned to operate in the SLC mode) and data access is now enabled. In other words, the SLC region has grown from 0 data locations to 30 data locations (0-29).

IV.B.I Access Enablement Options

The transition from Illustrations 2 to 3 can occur in a number of ways. In one embodiment, data access to the newly assigned data locations (e.g., 0-29 in Illustrations 2-3) occurs immediately upon receipt of a command from the controller to adjust the initial starting address to the new starting address. In other embodiments, data access to the newly assigned data locations can be delayed—in a direct or an indirect manner. In one embodiment, the access is enabled directly upon receipt of a later command from the controller to activate access. In another embodiment, the access is enabled indirectly upon receipt of a later command not specifically for access activation. For example, it could be a data access (e.g., write) command from the controller to one of the newly assigned data locations.

In Illustration 4, the ending address of the Reserved region is adjusted (Max Block is set to 80) and in Illustration 5 the MLC region grows to include those locations (80—SLC_Max) that were formerly in the Reserved region. Much like the transition in Illustrations 2 to 3, data access to those data locations that are newly assigned to operate in the MLC mode may be enabled immediately, in a delayed fashion through a direct or indirect mechanism, as described above.

IV.B.II Growth Rules

It is noted that in one embodiment the bridge device is configured to allow for repeated adjustment of the starting or ending address to assign data locations in the reserved region to either the SLC or MLC region. For example, in response to commands from the controller, the bridge device may successively adjust to a new starting address that is greater than a prior starting address (e.g., Illustrations 2 to 3) and after each successive adjustment, assign the data locations located between the new starting address and the prior starting address to operate in a mode to match the operating mode of the data locations in the region that are adjacent to the prior starting address (SLC region in this example). The same repetition can be done on the MLC region side/ending address side. Note that the layout in these illustrations may be reversed, so that an MLC region may be in the lower address range and the SLC region may be in the higher address range.

In one embodiment, the bridge device ensures the adjustments are made only in the direction of reducing the size of the reserved region. In other words, the data locations in the reserved region can be assigned out to operate in the SLC or MLC mode to accommodate the growth of the adjacent SLC or MLC region, but data locations from the adjacent SLC or MLC region are not re-designated as being in the reserved region. This procedure allows the memory to be used in observance with rules set forth by some manufacturers such as warranty agreements, which prohibit data locations from being reset into a different mode of operating once a mode has been chosen and the data locations have been used in the chosen mode.

IV.B.III Reset Option

In one embodiment, the bridge device does optionally allow such reset of the operating mode to occur through a reset function that is executed, for example, based on a command from the controller 130. As shown in Illustration 6 of FIG. 5B, the boundaries of the Reserved region are reset. Thus, data locations that were previously assigned to join the adjacent regions are now back in the Reserved region. For example, data location 30 that was previously shown in Illustration 3 to have been set to operate in the SLC mode is now free to be re-assigned to operate in the MLC mode.

Optionally, a reset flag may be set to indicate that such a reset has occurred. Setting this flag would indicate that an operation constraint has been voided such as the endurance warranty. In some instances, the reset function may be useful for testing/development purposes but may be disabled in the field of use.

IV.B.IV Growth Summary, Example Use Cases

Figure 6:
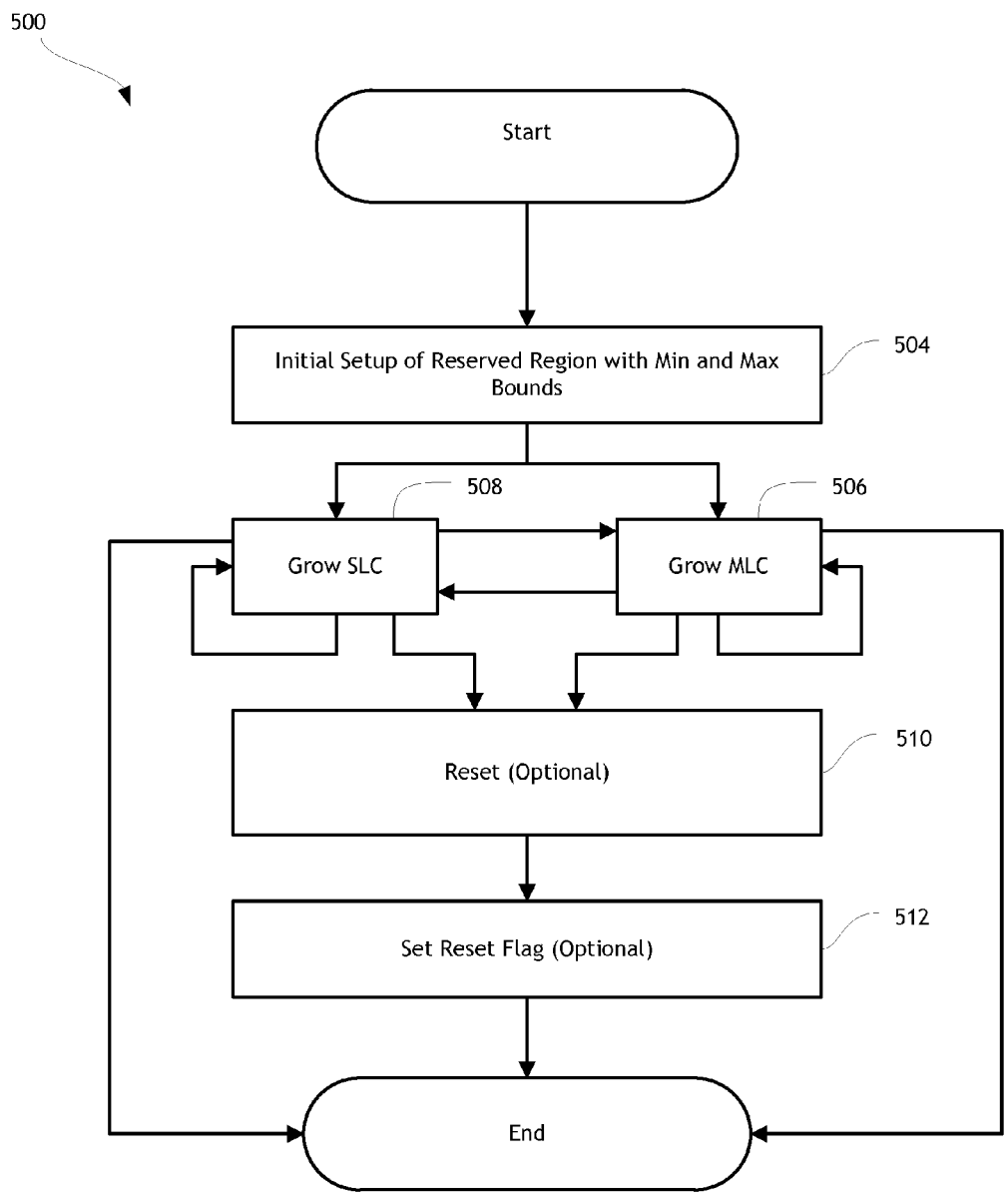
FIG. 6 is a flow diagram showing a process of configuring operating mode of data locations according to one embodiment.

The adjustment process is summarized in the flow chart of FIG. 6. The process 500 shown may be executed by the controller and/or the bridge device. In block 504, the bridge device and/or the controller performs the initial setup of the reserved region (e.g., setting the boundaries, etc.). In block 506 and 508, data locations in the reserved region may be assigned to operate in either SLC or MLC mode, to facilitate the growth of adjacent region of that mode as shown in the example in FIGS. 5A and 5B. As shown in the flow chart, either assignment can be repeated multiple times, in consecutive order or in a mixed sequence. Optionally, a reset may be performed in block 510 and a reset flag may be set in block 512.

In one embodiment, the growth of the MLC or SLC region into the reserved region is constrained by a threshold. So the bridge device may be configured to not adjust to the new starting address when it exceeds a threshold set in accordance to a manufacturer warranty constraint.

As solid state memory dies in the same storage device differ in aspects such as endurance and quality (e.g., read errors encountered), the reserved regions allow the controller and/or the bridge device to adjust for such variations encountered in the memory dies. For example, in some embodiments, the controller and/or the bridge device may designate data locations that correspond to physical memory locations that are determined to offer stronger performance to be in SLC mode. Such data locations may be reserved to store critical data such as system data or any other user data that are deemed critical to improve access time and endurance. As a specific example, some storage systems hard program certain data locations to be in SLC mode (e.g., the first 10 memory blocks) to store system critical data such as system tables. In contrast, in some embodiments, the reserved region offers each controller and/or bridge device in the field the ability to shift the SLC region storing system critical data if the controller and/or bridge device encounters quality issues in the first 10 memory blocks. In some embodiments, the controller and/or bridge device may designate data locations corresponding to higher quality physical memory locations to be in MLC mode to offset the inherent endurance disadvantages of MLC mode vis-à-vis SLC mode. Furthermore, the reserved regions also may serve to give the controller and/or bridge device opportunities to adjust usage of the overall system as the system wears out. In yet another embodiment, the controller and/or bridge device may take advantage of the reserved region to set a range of data locations in SLC mode to store data that can be when the system is in the low knowledge state (e.g., when the system is booting up and not all functionalities are activated yet). These functionalities allow the controller and/or bridge device to dynamically tune the memory regions in response to conditions such as usage patterns, media wear, and external constraints.

IV.C. Variations

FIGS. 7A and 7B show example operating mode configuration settings for multiple ranges of memory locations according to various embodiments. FIG. 7A shows a general configuration that a reserved region can be between any two regions where the operating modes are set (e.g., a MLC or a SLC mode, or two different MLC modes, or two of the same modes). The configuration shown in FIGS. 5A and 5B is a particular case of this general configuration. As previously shown in FIG. 5A (Illustration 1), the reserved region may initially start at a 0 address. In one embodiment, values indicating the region boundaries are stored and adjusted accordingly to assignment of data locations of the reserved region to accommodate the growth of the adjacent regions. For example, in the scheme of FIG. 7A, each MLC/SLC non-reserved region may have a pair of top/bottom values indicating the range of addresses it occupies. Alternatively or in addition, the boundaries of the reserved regions may be kept.

FIG. 7B shows the extension of the concept of FIG. 7A where there are multiple reserved regions across an address range and the reserved regions are not adjacent to one another. Each pair of top/bottom values tracks the boundaries of the non-reserved regions. Alternatively or in addition, the boundaries of the reserved regions may be kept. The non-reserved regions in FIG. 7B can then be flexibly grown to consume the reserved regions scattered throughout.

The use of reserved region throughout an address range may be useful in many situations. For example, the storage device may be configured to be accessed by multiple buses, with each bus having access to a certain sub-range. In that scenario, each sub-range may be assigned one or more reserved regions so that the flexibility offered by those regions may be provided to the individual controllers associated with the buses. More generally, the various configurations described herein provide any controller the ability to adjust allocation of data locations to MLC/SLC mode to suit its needs.

Figure 8A:
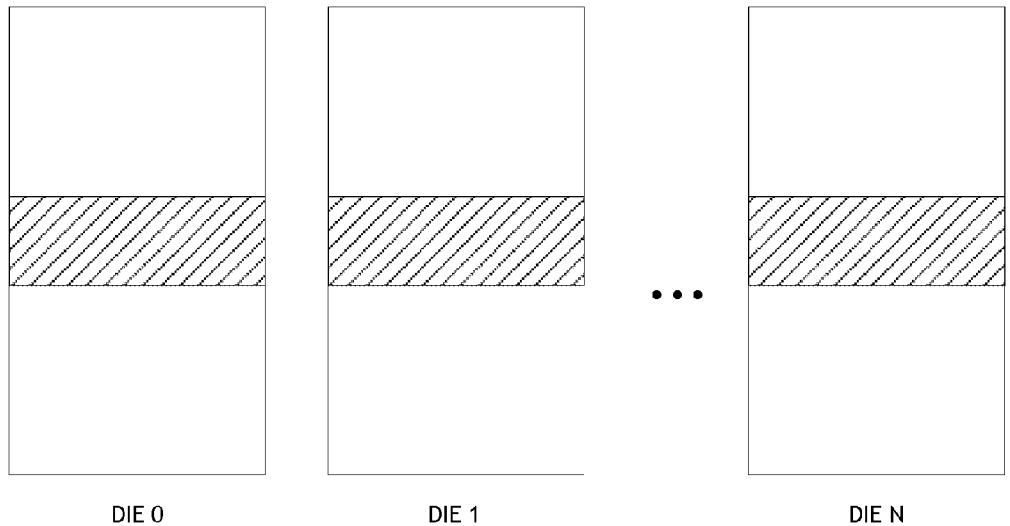
FIGS. 8A and 8B show example configurations across multiple memory devices according to various embodiments.
Figure 8B:
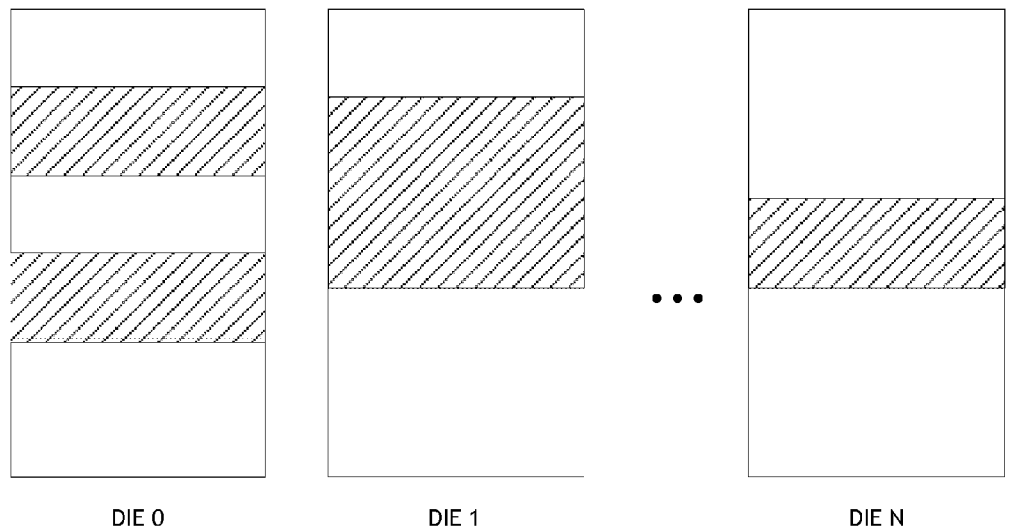

FIGS. 8A and 8B illustrate that the different configurations that may be used in different embodiments. FIG. 8A shows an embodiment in which all dies (or all planes across the dies) share the same configuration so that changes to the reserved region boundaries take place across the dies. FIG. 8B shows an embodiment that allows each die to have a different configuration and be allowed to change individually. In some embodiments, the dies may be divided into subsets where dies in the same subset share the same configuration and are affected in the same way when the boundaries change within the shared configuration.

V. Alternative Embodiments; Conclusion

As used in this application, "non-volatile memory" typically refers to solid-state memory such as NAND flash. However, the systems and methods of this disclosure may also be useful in more conventional hard drives and hybrid drives including both solid-state and hard drive components. As such, while certain internal operations are referred to which typically are associated with solid-state drives, such as "wear leveling" and "garbage collection," analogous operations for hard drives can also take advantage of some embodiments of this disclosure. Solid-state memory may comprise a wide variety of technologies, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), or other discrete NVM (non-volatile memory) chips. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, the various components illustrated in FIGS. 1D, 2A, 2B, 3, and 4 may be implemented as software and/or firmware on a processor, ASIC/FPGA, or dedicated hardware. For example, those skilled in the art will appreciate that in some embodiments, the actual steps taken in the processes shown in FIG. 6 may differ from those shown in the figures. Depending on the embodiment, certain of the steps described in the example above may be removed, others may be added, and the sequence of steps may be altered and/or performed in parallel. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A non-volatile data storage system, comprising:
a controller;
an array of one or more solid-state memory storage devices, the memory storage devices including a plurality of multi-level cell (MLC) memory data locations capable of operating in a MLC mode and a single-level cell (SLC) mode; and
a bridge device coupled with the array, the bridge device configured to:
define a first and second region within at least some of the MLC memory data locations, wherein:
the first region includes data locations operating in the SLC or in the MLC mode;
the second region includes data locations configured to be assigned to operate in either the SLC or MLC mode;
assign data locations in the second region to operate in the SLC or MLC mode in response to a command from the controller; and
prevent data access to the data locations in the second region until they are assigned to operate in either the SLC or MLC mode.

2. The data storage system of claim 1, wherein the second region is defined by an initial starting address and initial ending address.

3. The data storage system of claim 2, wherein the initial starting address indicates a boundary between the first and the second regions.

4. The data storage system of claim 2, wherein the bridge device is further configured to assign data locations in the second region to operate in the SLC or MLC mode by at least:
adjusting the initial starting address to a new starting address;
assigning the data locations located in the second region between the initial starting address and the new starting address to operate in the SLC mode or in the MLC mode, to match the operating mode of the data locations in the first region that are adjacent to the initial starting address; and
enabling data access to the newly assigned data locations.

5. The data storage system of claim 4, wherein enabling the data access comprises one of the following:
enabling data access to the newly assigned data locations immediately upon receipt of a command from the controller to adjust the initial starting address to the new starting address;
enabling data access to the newly assigned data locations upon receipt of a command from the controller to activate access; and
enabling data access to the newly assigned data locations upon receipt of a command from the controller not specifically for access activation.

6. The data storage system of claim 4, wherein the bridge device is further configured to:
in response to commands from the controller, successively adjust to a new starting address, wherein each new starting address is greater than a prior starting address; and
after each successive adjustment to the new starting address, assign the data locations located between the new starting address and the prior starting address to operate in a mode to match the operating mode of the data locations in the first region that are adjacent to the prior starting address.

7. The data storage system of claim 4, wherein the bridge device is further configured to not adjust to the new starting address when it exceeds a threshold set in accordance to a manufacturer warranty constraint.

8. The data storage system of claim 4, wherein the bridge device is further configured to reset the new starting address to the initial starting address upon a command from the controller.

9. The data storage system of claim 8, wherein the bridge device is further configured to set a reset flag upon the reset.

10. The data storage system of claim 2, wherein the bridge device is further configured to define, within the at least some MLC memory data locations, a third region that includes data locations operating in the SLC or in the MLC mode and wherein the initial ending address indicates a boundary between the second and the third regions.

11. The data storage system of claim 10, wherein the bridge device is further configured to assign data locations in the second region to operate in the SLC or MLC mode by at least:
adjusting the initial ending address to a new ending address;
assigning the data locations located in the second region between the initial ending address and the new ending address to operate in the SLC mode or in the MLC mode, to match the operating mode of the data locations in the third region that are adjacent to the initial ending address; and
enabling data access to the newly assigned data locations.

12. The data storage system of claim 11, wherein enabling the data access comprises one of the following:
enabling data access to the newly assigned data locations immediately upon receipt of a command from the controller to adjust the initial ending address to the new ending address;
enabling data access to the newly assigned data locations upon receipt of a command from the controller to activate access; and
enabling data access to the newly assigned data locations upon receipt of a command from the controller not specifically for access activation.

13. The data storage system of claim 11, wherein the bridge device is further configured to:
in response to commands from the controller, successively adjust to a new ending address, wherein each new ending address is smaller than a prior ending address; and
after each successive adjustment to the new ending address, assign the data locations located between the new ending address and the prior ending address to operate in a mode to match the operating mode of the data locations in the third region that are adjacent to the prior ending address.

14. The data storage system of claim 11, wherein the bridge device is further configured to not adjust to the new ending address when it exceeds a threshold set in accordance to a manufacturer warranty constraint.

15. The data storage system of claim 11, wherein the bridge device is further configured to reset the new ending address to the initial ending address upon a command from the controller.

16. The data storage system of claim 15, wherein the bridge device is further configured to set a reset flag upon the reset.

17. The data storage system of claim 10, wherein the first region includes data locations operating in the SLC mode and the third region includes data location operating in the MLC mode.

18. The data storage system of claim 1, wherein the bridge device includes one or more configuration registers and the command from the controller is indicated through setting of the one or more registers.

19. The data storage system of claim 1, wherein the bridge device is further configured to:
- define, within the at least some MLC memory data locations, a fourth region that includes data locations configured to be assigned to operate in either the SLC or MLC mode;
- assign data locations in the fourth region to operate in the SLC or MLC mode in response to a command from the controller; and
- prevent data access to the data locations in the fourth region until they are assigned to operate in either the SLC or MLC mode.

20. The data storage system of claim 19, wherein the second and the fourth regions are not adjacent to each other.

21. The data storage system of claim 1 further comprising rotating magnetic media under control of the controller.

22. A method of operating a bridge device in a non-volatile data storage system comprising (1) a controller, (2) an array of one or more solid-state memory storage devices, the memory storage devices including a plurality of multi-level cell (MLC) memory data locations capable of operating in a MLC mode and a single-level cell (SLC) mode, and (3) the bridge device coupled with the array, the method comprising:
- defining a first and second region within at least some of the MLC memory data locations, wherein:
  - the first region includes data locations operating in the SLC or in the MLC mode;
  - the second region includes data locations configured to be assigned to operate in either the SLC or MLC mode;
- assigning data locations in the second region to operate in the SLC or MLC mode in response to a command from the controller; and
- preventing data access to the data locations in the second region until they are assigned to operate in either the SLC or MLC mode.

23. The method of claim 22, wherein the second region is defined by an initial starting address and initial ending address.

24. The method of claim 23, wherein the initial starting address indicates a boundary between the first and the second regions.

25. The method of claim 23, wherein assigning data locations in the second region to operate in the SLC or MLC mode further comprises:
- adjusting the initial starting address to a new starting address;
- assigning the data locations located in the second region between the initial starting address and the new starting address to operate in the SLC mode or in the MLC mode, to match the operating mode of the data locations in the first region that are adjacent to the initial starting address; and
- enabling data access to the newly assigned data locations.

26. The method of claim 25, wherein enabling the data access comprises one of the following:
- enabling data access to the newly assigned data locations immediately upon receipt of a command from the controller to adjust the initial starting address to the new starting address;
- enabling data access to the newly assigned data locations upon receipt of a command from the controller to activate access; and
- enabling data access to the newly assigned data locations upon receipt of a command from the controller not specifically for access activation.

27. The method of claim 25, further comprising:
- in response to commands from the controller, successively adjusting to a new starting address, wherein each new starting address is greater than a prior starting address; and
- after each successive adjustment to the new starting address, assigning the data locations located between the new starting address and the prior starting address to operate in a mode to match the operating mode of the data locations in the first region that are adjacent to the prior starting address.

28. The method of claim 25, further comprising not adjusting to the new starting address when it exceeds a threshold set in accordance to a manufacturer warranty constraint.

29. The method of claim 25, further comprising resetting the new starting address to the initial starting address upon a command from the controller.

30. The method of claim 29, further comprising setting a reset flag upon the resetting.

31. The method of claim 23, further comprising defining, within the at least some MLC memory data locations, a third region that includes data locations operating in the SLC or in the MLC mode and wherein the initial ending address indicates a boundary between the second and the third regions.

32. The method of claim 31, wherein assigning data locations in the second region to operate in the SLC or MLC mode comprises:
- adjusting the initial ending address to a new ending address;
- assigning the data locations located in the second region between the initial ending address and the new ending address to operate in the SLC mode or in the MLC mode, to match the operating mode of the data locations in the third region that are adjacent to the initial ending address; and
- enabling data access to the newly assigned data locations.

33. The method of claim 32, wherein enabling the data access comprises one of the following:
- enabling data access to the newly assigned data locations immediately upon receipt of a command from the controller to adjust the initial ending address to the new ending address;
- enabling data access to the newly assigned data locations upon receipt of a command from the controller to activate access; and
- enabling data access to the newly assigned data locations upon receipt of a command from the controller not specifically for access activation.

34. The method of claim 32, further comprising:
- in response to commands from the controller, successively adjusting to a new ending address, wherein each new ending address is smaller than a prior ending address; and
- after each successive adjustment to the new ending address, assigning the data locations located between the new ending address and the prior ending address to operate in a mode to match the operating mode of the data locations in the third region that are adjacent to the prior ending address.

35. The method of claim 32, further comprising not adjusting to the new ending address when it exceeds a threshold set in accordance to a manufacturer warranty constraint.

36. The method of claim 32, further comprising resetting the new ending address to the initial ending address upon a command from the controller.

37. The method of claim 36, further comprising setting a reset flag upon the resetting.

38. The method of claim 31, wherein the first region includes data locations operating in the SLC mode and the third region includes data location operating in the MLC mode.

39. The method of claim 22, wherein the bridge device includes one or more configuration registers and the command from the controller is indicated through setting of the one or more registers.

40. The method of claim 22, further comprising:
defining, within the at least some MLC memory data locations, a fourth region that includes data locations configured to be assigned to operate in either the SLC or MLC mode;
assigning data locations in the fourth region to operate in the SLC or MLC mode in response to a command from the controller; and
preventing data access to the data locations in the fourth region until they are assigned to operate in either the SLC or MLC mode.

41. The method of claim 40, wherein the second and the fourth regions are not adjacent to each other.

42. The method of claim 22, wherein the data storage system further comprises rotating magnetic media under control of the controller.

43. A bridge device configured to be coupled with (1) an array of one or more solid-state memory storage devices, the memory storage devices including a plurality of multi-level cell (MLC) memory data locations capable of operating in a MLC mode and a single-level cell (SLC) mode and (2) a controller in a non-volatile data storage system, the bridge device configured to:
define a first and second region within at least some of the MLC memory data locations, wherein:
the first region includes data locations operating in the SLC or in the MLC mode;
the second region includes data locations configured to be assigned to operate in either the SLC or MLC mode;
assign data locations in the second region to operate in the SLC or MLC mode in response to a command from the controller; and
prevent data access to the data locations in the second region until they are assigned to operate in either the SLC or MLC mode.

44. A non-volatile data storage system, comprising:
a controller;
an array of one or more solid-state memory storage devices, the memory storage devices including a plurality of multi-level cell (MLC) memory data locations capable of operating in a plurality of MLC modes and a single-level cell (SLC) mode; and
a bridge device coupled with the array, the bridge device configured to:
define a first and second region within at least some of the MLC memory data locations, wherein:
the first region includes data locations operating in the SLC mode or in one of the plurality of MLC modes;
the second region includes data locations configured to be assigned to operate in the SLC mode or one of the plurality of MLC modes;
assign data locations in the second region to operate in the SLC or one of the plurality MLC modes in response to a command from the controller; and
prevent data access to the data locations in the second region until they are assigned to operate in either the SLC or one of the plurality of MLC modes.

\* \* \* \* \*